United States Patent [19]
Ueda

[11] Patent Number: 5,126,824
[45] Date of Patent: Jun. 30, 1992

[54] CARRIER TAPE

[75] Inventor: Tetsuya Ueda, Itami, Japan

[73] Assignee: Mitsubishi Denki Kabushiki Kaisha, Japan

[21] Appl. No.: 437,620

[22] Filed: Nov. 17, 1989

[30] Foreign Application Priority Data

Aug. 9, 1989 [JP] Japan .................... 1-204801

[51] Int. Cl.⁵ .............................. H01L 23/12
[52] U.S. Cl. .......................... 357/70; 357/80
[58] Field of Search ............. 357/70, 80, 72; 174/52.4

[56] References Cited

U.S. PATENT DOCUMENTS

| | | | |
|---|---|---|---|
| 5,018,003 | 5/1991 | Yasunaga et al. | 357/72 |
| 5,064,706 | 11/1991 | Ueda et al. | 428/131 |

FOREIGN PATENT DOCUMENTS

| | | | |
|---|---|---|---|
| 59-169162 | 9/1984 | Japan | 357/70 |
| 61-8960 | 1/1986 | Japan | 357/70 |
| 62-200749 | 9/1987 | Japan | 357/70 |
| 63-131557 | 6/1988 | Japan | 357/70 |

*Primary Examiner*—Andrew J. James
*Assistant Examiner*—S. V. Clark
*Attorney, Agent, or Firm*—Leydig, Voit & Mayer

[57] ABSTRACT

A carrier tape and a method of manufacturing a semiconductor device employing the same. The carrier tape has an insulating film and a plurality of leads. The film has an opening for receiving a semiconductor chip therein, a plurality of outer lead holes formed at the periphery of the opening, a lead supporting portion positioned between the opening and the outer lead holes, and at least one tie bar separating a pair of mutually opposing outer lead holes. The tie bar divides the associated outer lead hole and is connected to the lead supporting portion to prevent the lead supporting portion from sagging. The plurality of leads of the carrier tape are supported on the lead supporting portion of the film, projecting into the opening of the film. During manufacture, a semiconductor chip having a plurality of electrodes is positioned within the opening, and the one end portion of each lead is electrically connected to one of the electrodes of the semiconductor chip. The chip and carrier tape are placed within a cavity of a mold, and resin is injected into the cavity along the tie bar.

4 Claims, 8 Drawing Sheets

FIG. IA
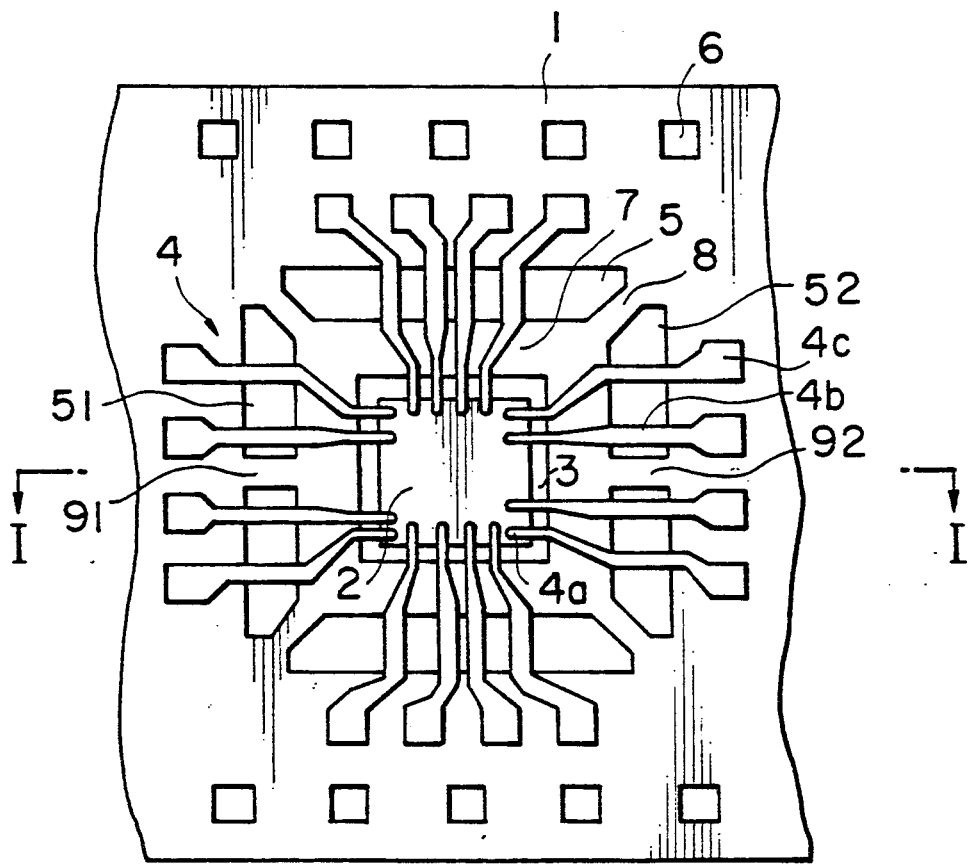
FIG. IB
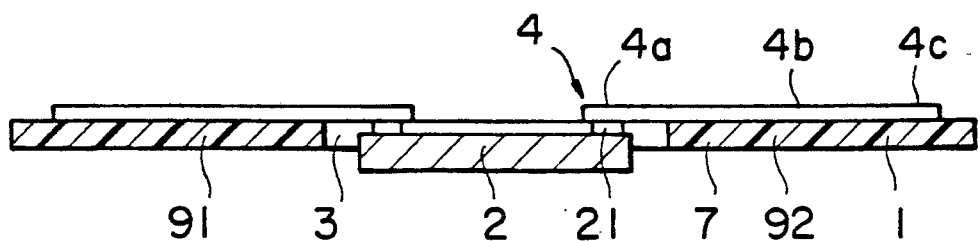

CARRIER TAPE

BACKGROUND OF THE INVENTION

1. Field of the Invention

The present invention relates to a carrier tape on which semiconductor chips are to be mounted by a tape automated bonding (TAB) method and also relates to a method of manufacturing a semiconductor device employing the carrier tape.

2. Description of the Related Art

FIGS. 7A and 7B are a plan view and a sectional view, respectively, of a part of a conventional carrier tape on which a semiconductor chip is mounted. The carrier tape has a film 1 formed of an insulating material such as polyimide. The film 1 has a plurality of perforations 6 formed at equal intervals along edge portions on either side thereof, and a rectangular center device hole 3 formed centrally between the edges which allows a semiconductor chip 2 to be received therein. A plurality of outer lead holes 5 are formed at the periphery of the center device hole 3. A plurality of leads 4 formed of copper are secured to the surface of the film 1. These leads 4 are supported by a lead supporting portion 7 of the film positioned between the center device hole 3 and the outer lead holes 5, 5a, etc. A front end portion of each lead 4 projects into the center device hole 3 as an inner lead 4a, while an intermediate portion of the lead 4 is positioned above the corresponding outer lead hole 5, 5a as an outer lead 4b which is to be connected to an electrode of an external circuit. A test pad 4c is formed at the rear end of each lead 4. The lead supporting portion 7 is linked, at its four corners, to suitable portions of the film 1 by bridge portions 8 each positioned between two adjacent outer lead holes 5.

As shown in FIG. 7B, within the center device hole 3 of the carrier tape, the inner lead 4a of each lead 4 is connected to a bump electrode 21 of the semiconductor chip 2. Thus, a plurality of semiconductor chips 2 are usually mounted on a carrier tape.

Such a tape carrier is sealed with, for instance, in a resin package, in order to protect the semiconductor chips 2, the leads 4, etc. from external forces and the external environment. The resin packages are molded using, for instance, an upper mold part 10a and a lower mold part 10b which have a plurality of cavity halves 12a and 12b, respectively, that correspond to each other, as shown in FIG. 8. Figs. 9A and 9B show, at an enlarged scale, the cavity halves 12a and 12b of the upper and lower mold parts 10a and 10b, respectively. As shown in FIGS. 8 and 9A, the upper mold part 10a also has a runner 14 allowing a resin to flow therein, and a plurality of gates 13 through which the runnner 14 communicates with each of the cavity halves 12a.

During resin molding, the tape carrier is set between the upper mold part 10a and the lower mold part 10b, as shown in FIG. 10. At this time, the tape carrier is aligned in such a manner that each of the semiconductor chips 2 is received in one of the cavity halves 12b of the lower mold part 10b. Thereafter, the upper mold part 10a and the lower mold part 10b are clamped, and a molten resin 11 is injected into cavities defined by the cavity halves 12a of the upper mold part 10a and the cavity halves 12b of the lower mold part 10b, through the runner 14 and the gates 13. After the curing of the resin 11, a molded product, such as that shown in FIG. 11, is taken out from the upper and lower mold parts 10a and 10b. Subsequently, each of the leads 4 is cut along the boundary between the outer lead 4b, and the test pad 4c, and each of the bridge portions 8 of the film 1 is cut off, thereby producing packaged semi conductor devices.

The above described art, however, involves the following problems. Since each of the groove-shaped gates 13 of the upper mold part 10a is positioned above one of the outer lead holes 5a of the film 1, as shown in FIG. 10, during resin molding, a part of a molten resin 11 which is to be injected into the corresponding cavity flows through the gate 13 in the direction indicated by an arror A in FIG. 7A. As a result, the part of the resin 11 enters not only the cavity but also the outer lead hole 5a of the film 1, whereby an unnecessary resin portion 11a is formed, as shown in FIG. 11. Accordingly, it has been necessary after the resin molding process, to remove the unnecessary resin portions 11a, thereby inevitably complicating the manufacture of the packaged semiconductor devices.

In addition, since the leads 4 generally have a relatively small thickness of about 35 $\mu$m, their outer leads 4b tend to be broken when the unnecessary resin portions 11a are being removed. This leads to a reduction in yield.

SUMMARY OF THE INVENTION

The present invention has been accomplished in order to overcome the above-described problems. An object of the present invention is to provide a carrier type facilitating the manufacture of packaged semiconductor devices with high yield.

Another object of the present invention is to provide a method of manufacturing a packaged semiconductor device employing the carrier tape.

A carrier tape according to the present invention comprises: an insulating film having an opening for receiving a semiconductor chip therein, a plurality of outer lead holes formed adjacent the opening, a lead supporting portion positioned between the opening and the outer lead holes, and at least one tie bar dividing a pair of mutually opposing outer lead holes and connected to the lead supporting portion to prevent the lead supporting portion from sagging and to provide passage for the flow of a molten resin during resin molding of the semiconductor chip; and a plurality of leads supported on the lead supporting portion of the insulating film, and projecting into the opening of the insulating film.

A method of manufacturing a semiconductor device according to the present invention comprises the steps of: positioning a semiconductor chip having a plurality of electrodes within an opening in an insulating film of a carrier tape that includes a plurality of leads, a plurality of outer lead holes formed adjacent the opening, a lead supporting portion positioned between the opening and the outer lead holes, and at least one tie bar separating a pair of mutually opposing outer lead holes, the tie being connected to the lead supporting portion to prevent the lead supporting portion from sagging, the plurality of leads of the carrier tape being supported on the lead supporting portion of the insulating film and projecting into the opening of the insulating film; electrically connecting the leads to respective electrodes of the semiconductor chip; placing the semiconductor chip within a cavity of a mold; injecting a molten resin into the cavity of the mold flowing molten resin through a passage along the bar tie and curing of the resin.

BRIEF DESCRIPTION OF THE DRAWINGS

FIG. 1A is a fragmentary plan view of a carrier tape in accordance with a first embodiment of the present invention;

FIG. 1B is a sectional view taken along the line I—I of FIG. 1A;

DESCRIPTION OF THE PREFERRED EMBODIMENTS

Figure 2:
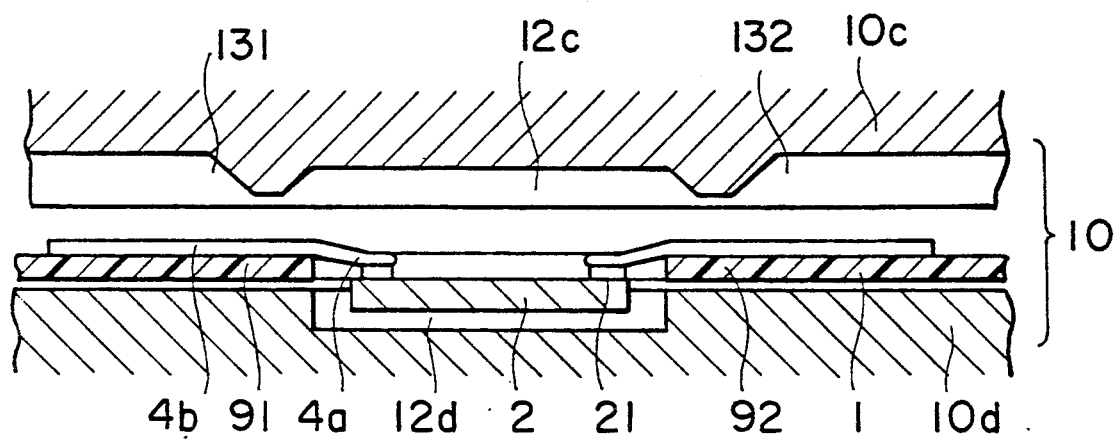
FIGS. 2 and 3 are sectional views illustrating a molding process employing the carrier tape in accordance with the first embodiment.

Certain embodiments of the present invention will now be described with reference to the accompanying drawings.

Referring to FIGS. 1A and 1B, a carrier tape has an insulating film 1 formed of a material such as polymide. The film 1 has a plurality of perforations 6 formed at equal intervals along edge portions on either side thereof, and a rectangular center device hole 3 formed centrally between the edges for receiving a semiconductor chip 2. A plurality of outer lead holes 5 are formed adjacent the periphery of the center device hole 3. A plurality of leads 4 formed of copper are secured to the surface of the film 1. These leads 4 are supported by a lead supporting portion 7 positioned between the center device hole 3 and the outer lead holes 5. A front end portion of each lead 4 projects into the center device hole 3 as an inner lead 4a, while an intermediate portion of the lead 4 is positioned above the corresponding outer lead hole 5 as an outer lead 4b which is to be connected to an electrode of an external circuit. A test pad 4c is formed at the rear end of each lead 4. The lead supporting portion 7 is linked to the film 1 by bridge portions 8 each positioned between adjacent outer lead holes 5.

one pair of outer lead holes 5, namely, mutually opposing lead holes 51 and 52, include center tie bars 91 and 92 respectively. Each of the center tie bars 91 and 92 divides the associated outer lead hole 51 or 52, and is connected, at one end thereof, to the associated lead support portion 7. When the semiconductor chip 2 to be mounted has such a large size that the sides of the lead supporting portion 7 have a length of, for instance, 38 mm or greater, and the lead supporting portion 7 is supported solely by the bridge portions 8 at the four corners of the lead supporting portion 7, there is a risk that the lead supporting portion 7 may sag. Therefore, according to this embodiment, the center tie bars 91 and 92 are provided to prevent sagging of the lead supporting portion 7. Because these center tie bars 91 and 92 will be used as passages through which a molten resin flows during the resin molding of the semiconductor chip 2, they should preferably be formed with a width of at least 1.5 mm. None of the leads 4 is disposed on these center tie bars 91 and 92.

Next, descriptions will be given of a method of manufacturing a semiconductor device employing the carrier tape having the above-described construction.

First, as shown in FIG. 1B, a semiconductor chip 2 having a plurality of bump electrodes 21 formed on the surface thereof is positioned within the center device hole 3 of the carrier tape with each of the bump electrodes 21 aligned with the inner lead 4a of the corresponding lead 4. Thereafter, the bump electrodes 21 and the inner leads 4a are thermocompression bonded.

Subsequently, as shown in FIG. 2, the tape carrier is set between an upper mold part 10c and a lower mold part 10d which constitute a mold 10. At this time, the tape carrier is aligned in such a manner that the semiconductor chip 2 is received in a cavity half 12d of the lower mold part 10d. The upper mold part 10c is formed with a cavity half 12c corresponding to the cavity half 12d of the lower mold part 10d, and with a pair of groove-shaped gates 131 and 132 communicating with the cavity half 12c and being formed at positions corresponding to the center tie bars 91 and 92 of the carrier tape. The gates 131 and 132 have a width slightly narrower than that of the center tie bars 91 and 92 of the carrier tape.

Thereafter, the upper mold part 10c and the lower mold part 10d are clamped, and a molten resin 11 is injected in a low-pressure transfer into a cavity defined by the cavity half 12c of the upper mold part 10c and the cavity half 12d of the lower mold part 10d, through the gates 131 and 132. As stated before, since the groove-shaped gates 131 and 132 formed in the upper mold part 10c have a narrower width than the center tie bars 91 and 92 of the carrier tape, when the upper mold part 10c and the lower mold part 10d are clamped together, the gates 131 and 132 have their respective lower portions closed by the center tie bars 91 and 92, respectively, and become tubular-shaped. By virtue of this arrangement, during the injecting of a resin 11, the resin 11 is prevented from entering the outer lead holes 5 of the carrier tape.

Figure 3:
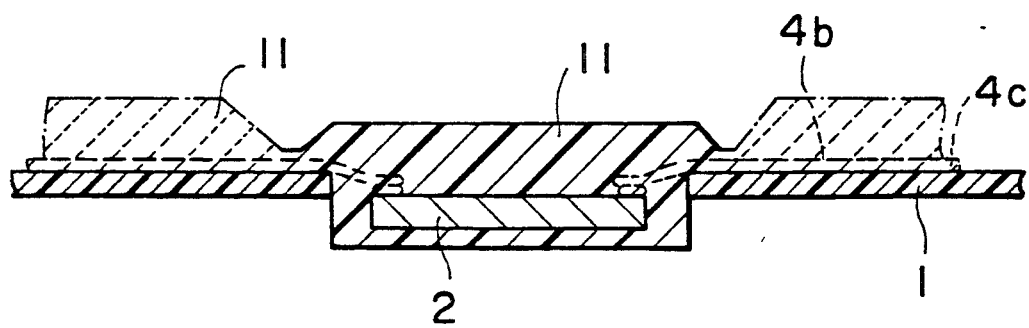

After the curing of the resin 11, the upper mold part 10c and the lower mold part 10d are opened, and a molded product, such as that shown in FIG. 3, is taken out of the mold 10. Subsequently, each of the leads 4 is cut along the boundary between the outer lead 4b and the test pad 4c, and the bridge portions 8 as well as the center tie bars 91 and 92 of the carrier tape are each cut off, thereby producing a packaged semiconductor device.

Figure 11:
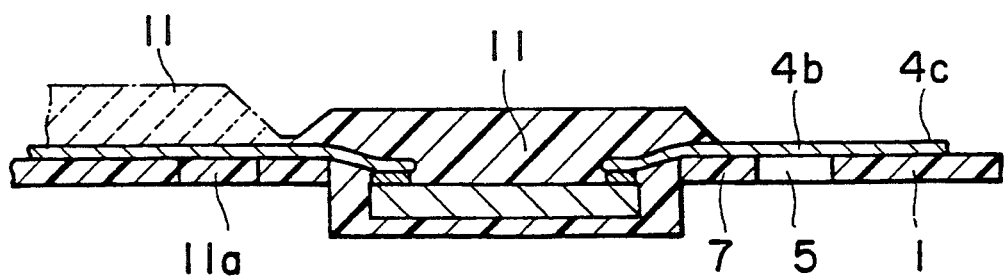

As described above, since, during resin molding, resin 11 is prevented from entering the outer lead holes 5 of the carrier tape, there is no need for any unnecessary molded resin portion, such as that shown in FIG. 11, to be removed after the molding process. It is therefore possible to avoid the risk of breaking the outer leads 4b of the leads 4.

In the above-described embodiment, molten resin 11 is injected through each of the pair of gates 131 and 132 formed in the upper mold part 10a. However, resin 11 may be alternatively injected through only one of the gates which corresponds to one of the pair of center tie bars 91 and 92 of the carrier tape.

Figure 4:
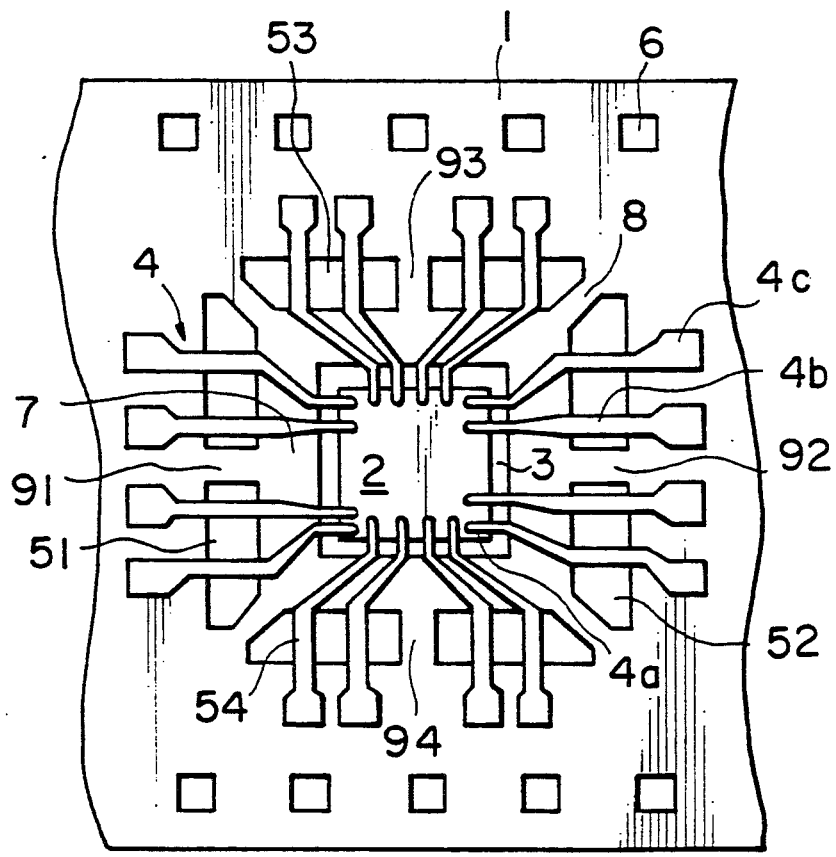
FIG. 4 is a fragmentary plan view of a carrier tape in accordance with a second embodiment of the present invention.
Figure 5:
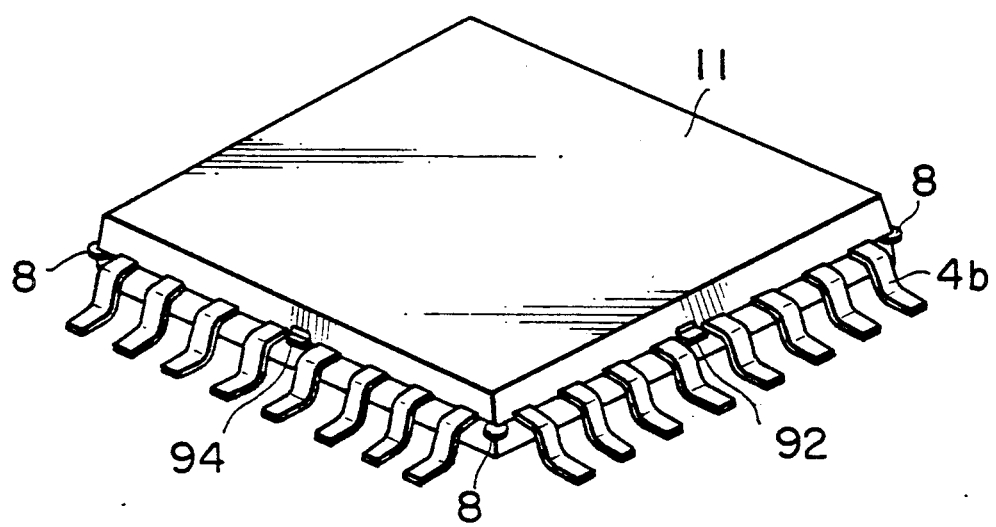
FIG. 5 is a perspective view of a packaged semiconductor device employing the carrier tape in accordance with the second embodiment.

When the semiconductor chip 2 has a substantially square configuration, and also has a large size, and, accordingly, all the four sides of the lead supporting portion 7 of the carrier tape have a relatively great length, an arrangement such as that shown in FIG. 4 should preferably be adopted to prevent sagging of the lead supporting portion 7. Specifically, in the second embodiment shown in FIG. 4, center tie bars 91 to 94 are disposed in all the four outer lead holes 51 to 54. FIG. 5 shows a semiconductor device manufactured employing a packaged carrier tape having center tie bars 91 to 94 provided in correspondence with all the four sides, as in the second embodiment. In the manufacture of the semiconductor device shown in FIG. 5, molten resin 11 may be injected either through four gates corresponding to the four center tie bars 91 to 94 of the carrier tape, or through a gate or gates corresponding to one to three of the four center tie bars 91 to 94.

Figure 6:
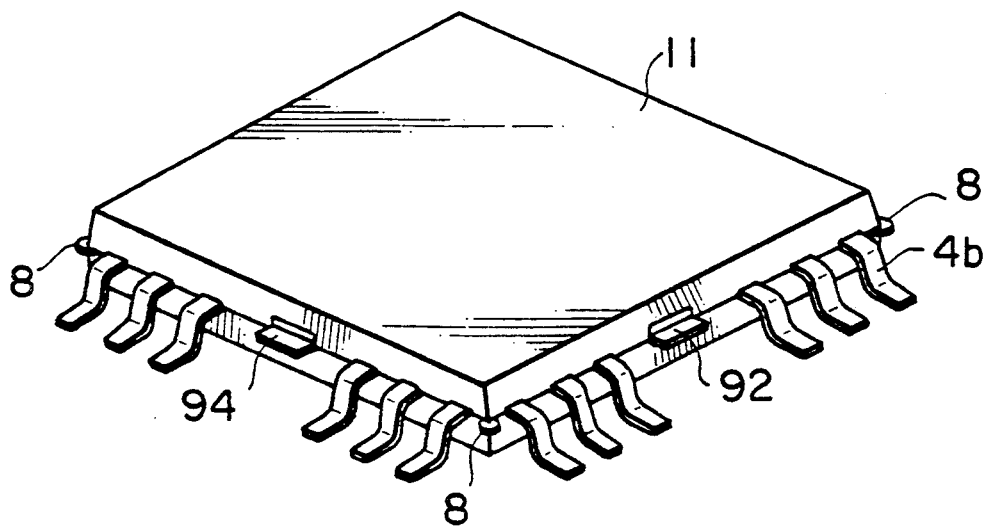
FIG. 6 is a perspective view of a packaged semiconductor device employing a carrier tape in accordance with a modification of the second embodiment.
Figure 7A:
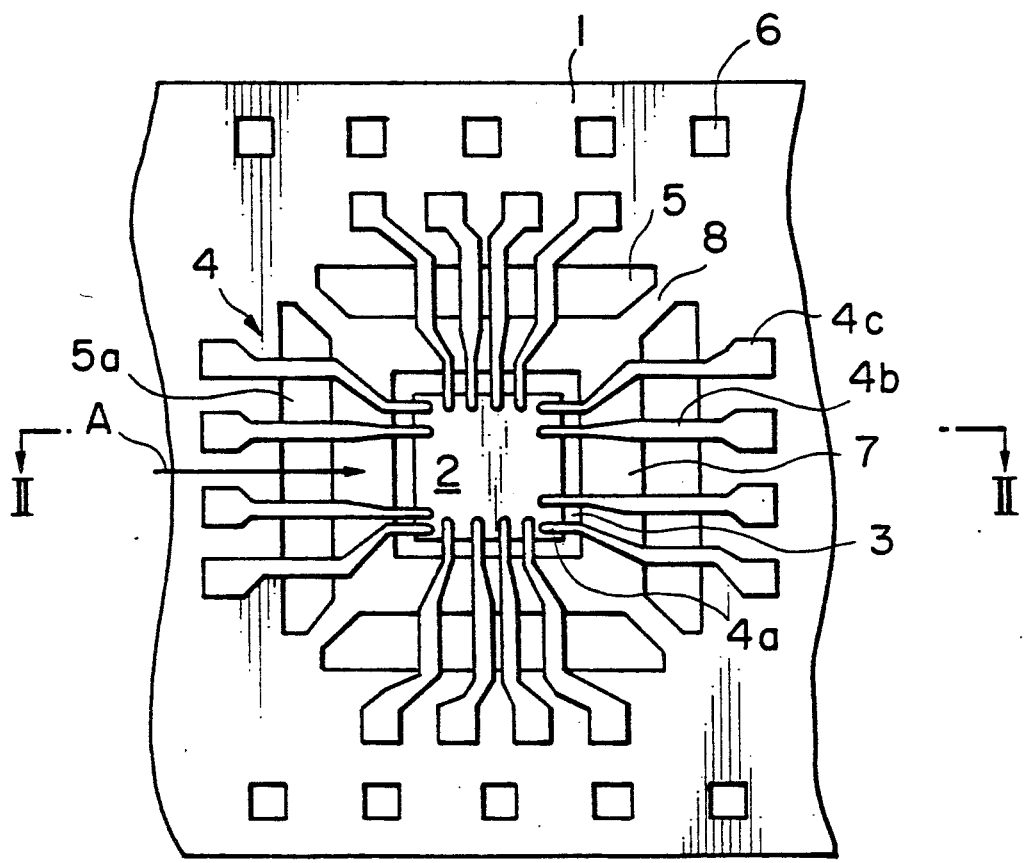
FIG. 7A is a fragmentary plan view of a conventional carrier tape.
Figure 7B:
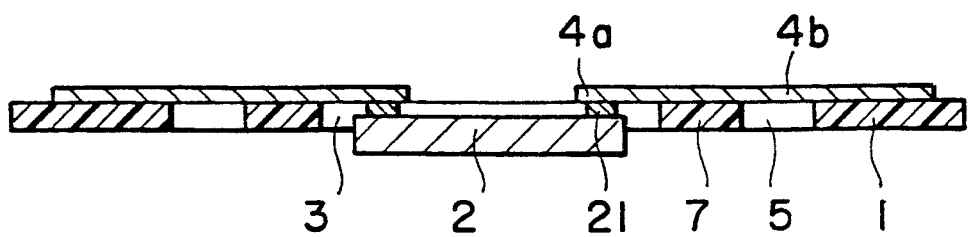
FIG. 7B is a sectional view taken along the line II—II of FIG. 7A.
Figure 8:
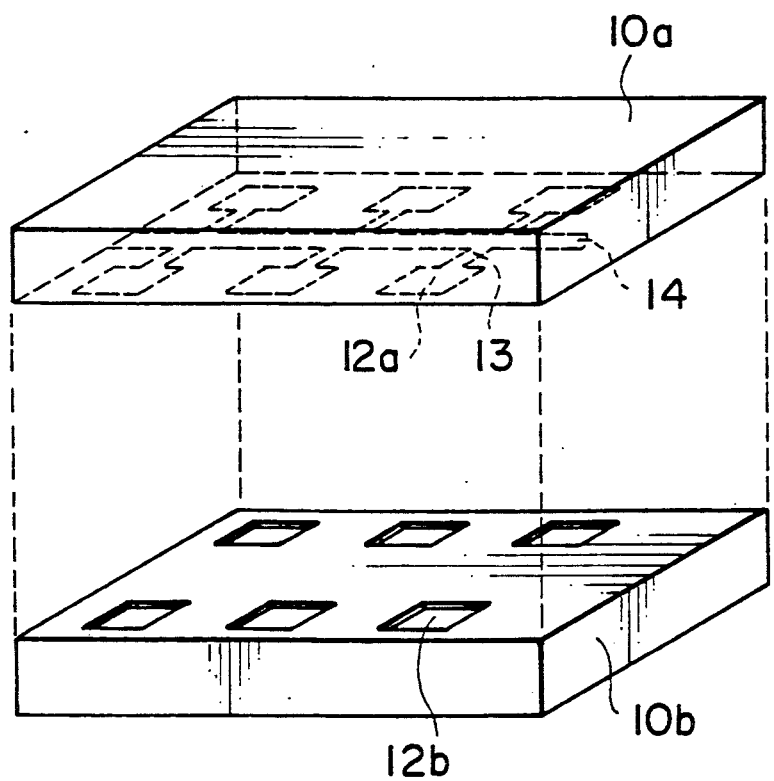
FIG. 8 is a perspective view of an upper mold part and a lower mold part which are used in resin molding.
Figure 9A:
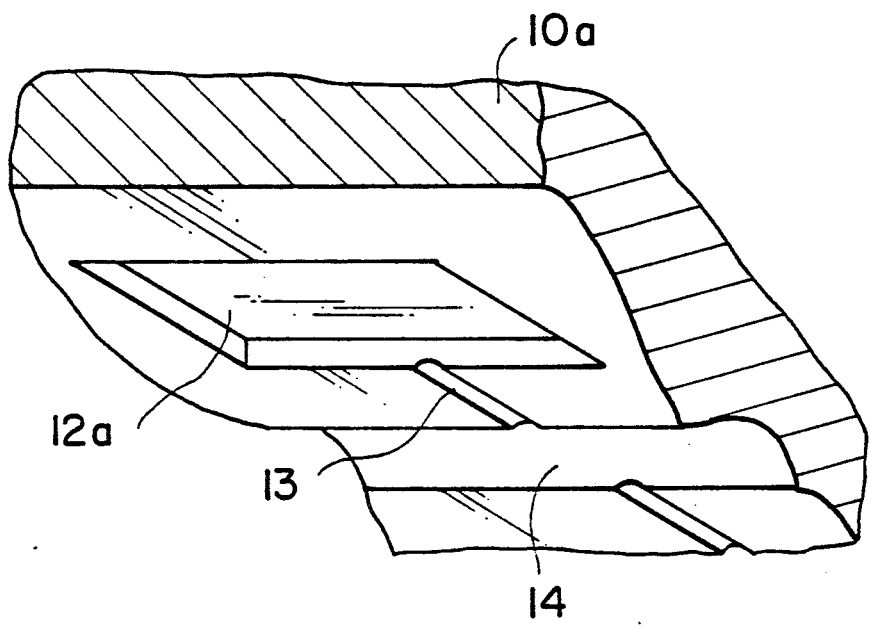
FIGS. 9A and 9B are fragmentary enlarged views of the upper mold part and the lower mold part, respectively, of FIG. 8.
Figure 9B:
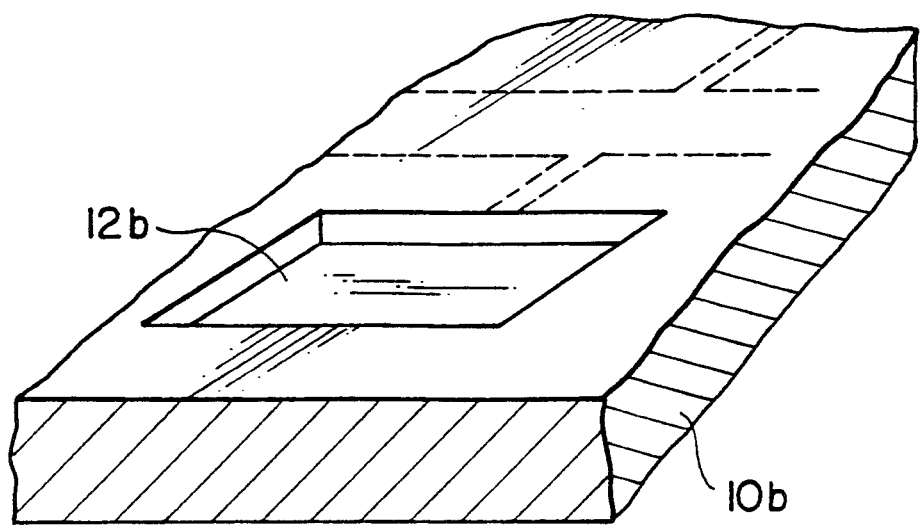
Figure 10:
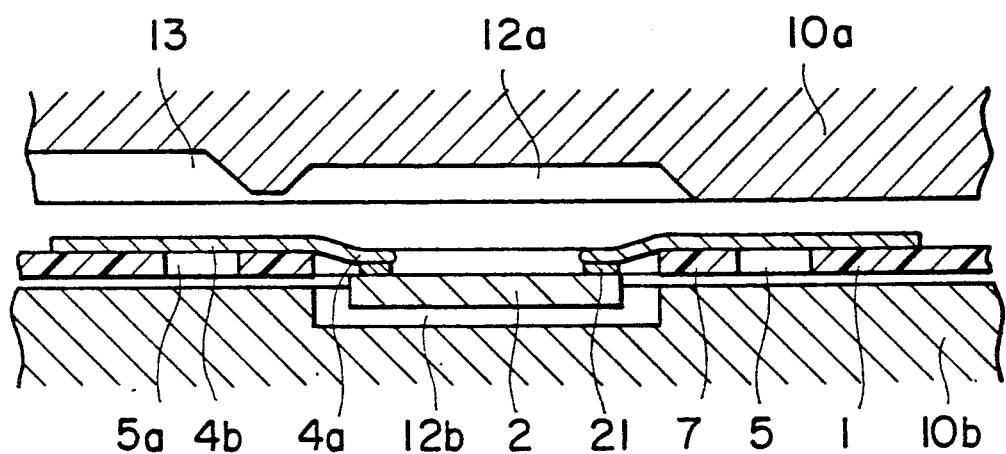
FIGS. 10 and 11 are sectional views illustrating a conventional method of manufacturing a packaged semiconductor device.

If one or several leads 4 are omitted from the vicinity of each of the center tie bars 91 to 94, it is possible to adopt a large value as the width of the center tie bars 91 to 94, as shown in FIG. 6. If the width of gates formed in a mold is a large value in correspondence with these center tie bars 91 to 94, this is advantageous in that it is possible to facilitate the injecting of molten resin 11, and also to avoid the risk of causing any defects such as incomplete molding or the generation of voids, thereby enabling positive resin molding to be effected.

Although not shown, when the semiconductor chip 2 to be mounted has certain configuration and/or size, the number of center tie bars formed in the carrier tape may be greater than four.

What is claimed is:

1. A carrier tape comprising:

a unitary, continuous insulating film including a rectangular opening having a periphery with four edges for receiving a semiconductor chip therein, a plurality of outer lead holes respectively spaced from and adjacent the edges of the rectangular opening, a lead supporting portion positioned between the rectangular opening and the outer lead holes and having lengths along at least two of the edges of the rectangular opening at least 38 millimeters long, and at least two tie bars respectively separating pairs of mutually opposing outer lead holes, extending toward the rectangular opening, and respectively connected to corresponding lengths of said lead supporting portion at least 38 millimeters long to prevent said lead supporting portion from sagging during resin molding of said film and a semi-conductor chip disposed in the rectangular opening; and a plurality of electrically conducting leads supported on said lead supporting portion of said insulating film and projecting into the rectangular opening in said insulating film.

2. A carrier tape according to claim 1 including eight outer lead holes formed in pairs along respective edges of the rectangular opening, one tie bar being disposed between each pair of the outer lead holes at an edge of the rectangular opening.

3. A carrier tape according to claim 1 wherein each of said tie bars has a width of not less than 1.5 mm.

4. A carrier tape according to claim 1 wherein said plurality of leads are positioned on said lead supporting portion spaced from said tie bars.

* * * * *